United States Patent [19]

Yoneda et al.

[11] Patent Number: 4,984,199

[45] Date of Patent: * Jan. 8, 1991

[54] SEMICONDUCTOR MEMORY CELLS HAVING COMMON CONTACT HOLE

[75] Inventors: Masahiro Yoneda; Masahiro Hatanaka; Yoshio Kohno; Shinichi Satoh; Hidekazu Oda; Koichi Moriizumi, all of Hyogo, Japan

[73] Assignee: Mitsubishi Denki Kabushiki Kaisha, Tokyo, Japan

[*] Notice: The portion of the term of this patent subsequent to Dec. 12, 2006 has been disclaimed.

[21] Appl. No.: 358,495

[22] Filed: May 30, 1989

Related U.S. Application Data

[63] Continuation of Ser. No. 94,647, Sep. 9, 1987, abandoned.

[30] Foreign Application Priority Data

Sep. 9, 1986 [JP] Japan .................................. 61-213107

[51] Int. Cl.⁵ ............................................. G11C 11/24
[52] U.S. Cl. ..................................... 365/149; 365/182; 357/23.6; 357/41
[58] Field of Search ............... 365/182, 149; 357/23.6, 357/41

[56] References Cited

U.S. PATENT DOCUMENTS

| | | | |
|---|---|---|---|
| 4,541,006 | 9/1985 | Ariizumi et al. | 365/182 |
| 4,651,183 | 5/1987 | Lange et al. | 357/41 |
| 4,654,825 | 3/1987 | Riverson | 365/182 |
| 4,737,837 | 4/1988 | Lee | 357/41 |
| 4,763,178 | 8/1988 | Sakui et al. | 357/23.6 |
| 4,887,137 | 12/1989 | Yoneda et al. | 357/23.6 |

FOREIGN PATENT DOCUMENTS

| | | |
|---|---|---|
| 0183517 | 6/1986 | European Pat. Off. . |
| 0169332 | 2/1989 | European Pat. Off. . |
| 3521059 | 12/1966 | Fed. Rep. of Germany . |
| 0041754 | 3/1980 | Japan ................................. 357/23.6 |

OTHER PUBLICATIONS

M. McCoy, "Chip Pirates: Beware of the Law" IEEE Spectrum, 1985, pp. 74–80.

Primary Examiner—Joseph E. Clawson, Jr.
Attorney, Agent, or Firm—Lowe, Price, LeBlanc, Becker & Shur

[57] ABSTRACT

A dynamic type semiconductor device comprises a memory cell array including a plurality of cell groups, each of the cell groups including four adjacent memory cells disposed in a point symmetry fashion, with a single contact hole formed at the center of the point symmetry to be common to the four memory cells, in which the four memory cells and bit lines are connected through the single contact hole.

10 Claims, 7 Drawing Sheets

SEMICONDUCTOR MEMORY CELLS HAVING COMMON CONTACT HOLE

This application is a continuation of application Ser. No. 07/094,647, filed Sept. 9, 1987 now abandoned.

CROSS-REFERENCE TO RELATED, COPENDING APPLICATION

Related, copending applications of particular interest to the instant application are U.S. Ser. No. 011,434, entitled "Semiconductor Memory Device", filed Jan. 29, 1987 and U.S. Ser. No. 041,672, entitled "Semiconductor Device and Method for Manufacturing the Same", filed Apr. 23, 1987, both assigned to the same assignee of the instant application.

BACKGROUND OF THE INVENTION

1. Field of the Invention

The present invention relates to a dynamic-type semiconductor memory device and, more particularly, to an improvement of an arrangement of memory cells and a structure of electrical connections.

2. Description of the Prior Art

A dynamic-type semiconductor memory device is already well known. FIG. 1 is a block diagram showing an overall structure of a dynamic-type semiconductor memory device.

Referring to FIG. 1, a dynamic-type semiconductor memory device comprises an array comprising a plurality of memory cells serving as a memory portion, a X decoder and a Y decoder coupled to the memory portion for selecting its address, an input interface portion comprising a sense amplifier connected to the memory portion and an I/O buffer. A plurality of memory cells serving as a memory portion are provided as an array at intersection points of word lines connected to the X decoder and bit lines connected to the Y decoder structured as a matrix.

An operation is now described. In operation, upon receipt of a row address signal and a column address signal provided from outside, a memory cell at an intersection point of a single word line and a single bit line selected by the x decoder and Y decoder is selected, and information therein is read and written through the I/O interface portion comprising a sense amplifier and the I/O buffer.

FIG. 2 is an enlarged view showing intersection points of two word lines and a bit line of a conventional dynamic-type semiconductor device and showing that two memory cells are selected separately by two word lines and a bit line through a common contact hole provided in the center.

FIG. 3 is a sectional view taken along the line A—A in FIG. 2. Referring to FIGS. 2 and 3, a source region 6a and a drain region 6b of a transistor 6 are formed on a major surface of a silicon substrate 1 and a capacitor region 4a is provided adjacent to the drain region 6b. These regions ar isolated by an isolating region 7 and a channel cut 8 is formed under the isolating region 7. Word lines 3 are formed on a channel region 3a between the source region 6a and the drain region 6b through a gate insulating film 3b. Also, a capacitor electrode 9 is formed on the capacitor region 4a through a capacitor insulating film 4b. A plane region formed of the capacitor electrode 9 is shown by hatching of dotted lines in FIG. 2. These word lines 3 and the capacitor electrode 9 are covered with an insulating layer 10. A bit line 5 formed on the insulating layer 10 is connected to the source region 6a common to the two transistors 6. That is, two capacitor regions 4a are connected to a single bit line 5 by one contact hole 2 through respective switching transistor 6.

As mentioned above, according to the conventional dynamic-type semiconductor memory device, since two memory cells are connected to a bit line through a single contact hole, contact holes as many as a half of the number of storage bits are necessary. Therefore, problems were caused that a high degree of integration of semiconductor memory device is difficult due to the region occupied by these many contact holes.

SUMMARY OF THE INVENTION

Accordingly, a major object of the present invention is to increase the degree of integration of a semiconductor memory device.

The above aim of the present invention is achieved by forming a single contact hole common to four memory cells by doubling the number of memory cells in a group of cells, although conventionally a single contact hole was formed common to two adjacent memory cells.

Briefly, the present invention comprises a dynamic-type semiconductor memory device comprising an array of memory cells provided at intersection points of a plurality of bit lines and a plurality of word lines including a plurality of cell groups, each said cell group including four adjacent memory cells arranged in symmetry with respect to a point, and a contact hole common to four memory cells formed in the center of point symmetry. Four contact regions connected to the respective memory cells are formed beneath said contact hole. Two memory cells in said memory cell group are connected to one line out of said bit lines and the other two memory cells are connected to the other line out of said bit lines through said contact hole.

According to the present invention, a dynamic-type semiconductor memory device comprises an array of memory cells comprising a plurality of cell-groups, each said cell-group comprising four adjacent memory cells arranged in symmetry with respect to a point and a contact hole common to said four memory cells in the center of point symmetry so as to be connected to said four memory cells through said one contact hole. Therefore, a connection can be made between bit lines and memory cells through one contact hole for four memory cells.

As a result, only half the number of contact holes are needed, whereas one contact hole was needed for two memory cells in the conventional dynamic-type semiconductor memory device. Therefore, a meritorious effect is brought about that a high degree of integration of a dynamic-type semiconductor memory device is possible.

According to a preferred embodiment, a contact hole is arranged in the center of point symmetry of four memory cells in a group such that two bit lines may pass through each memory cell group. Therefore, there is an advantage that the operation is performed with a higher degree of integration to take in and out the information to and from each memory cell in the same operation manner as the conventional one.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
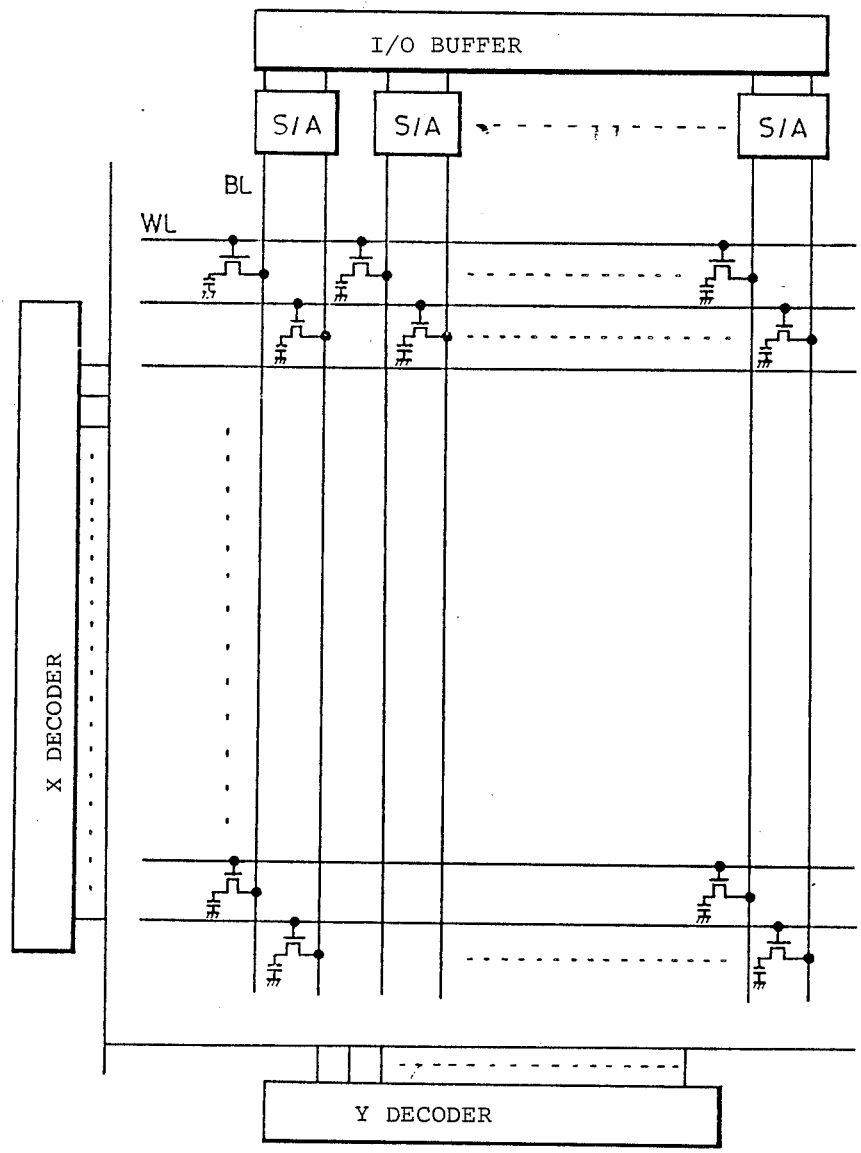
FIG. 1 is a block diagram showing an overall structure of a typical conventional dynamic-type semiconductor device.
Figure 2:
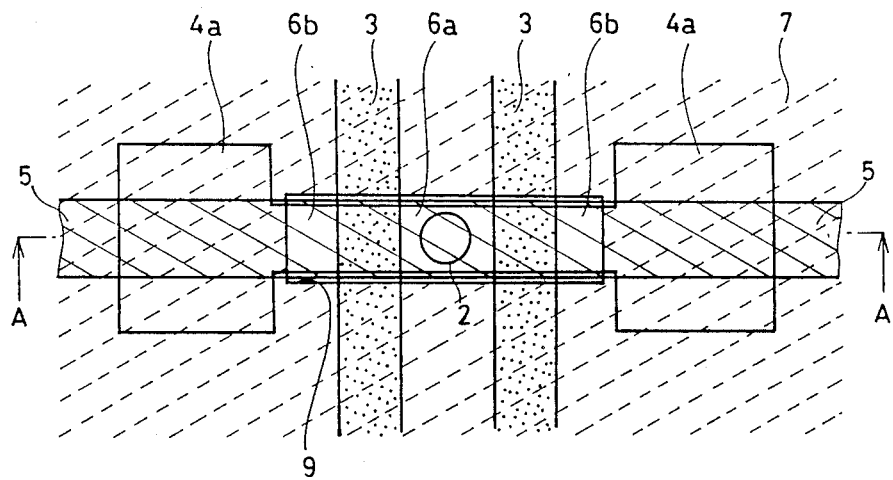
FIG. 2 is a plan view showing a conventional dynamic-type semiconductor memory device.
Figure 3:
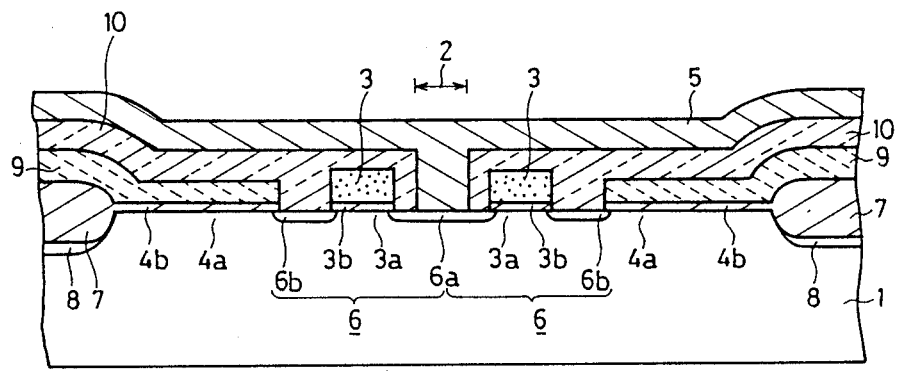
FIG. 3 is a schematic sectional view taken along the line A—A in FIG. 2.
Figure 4:
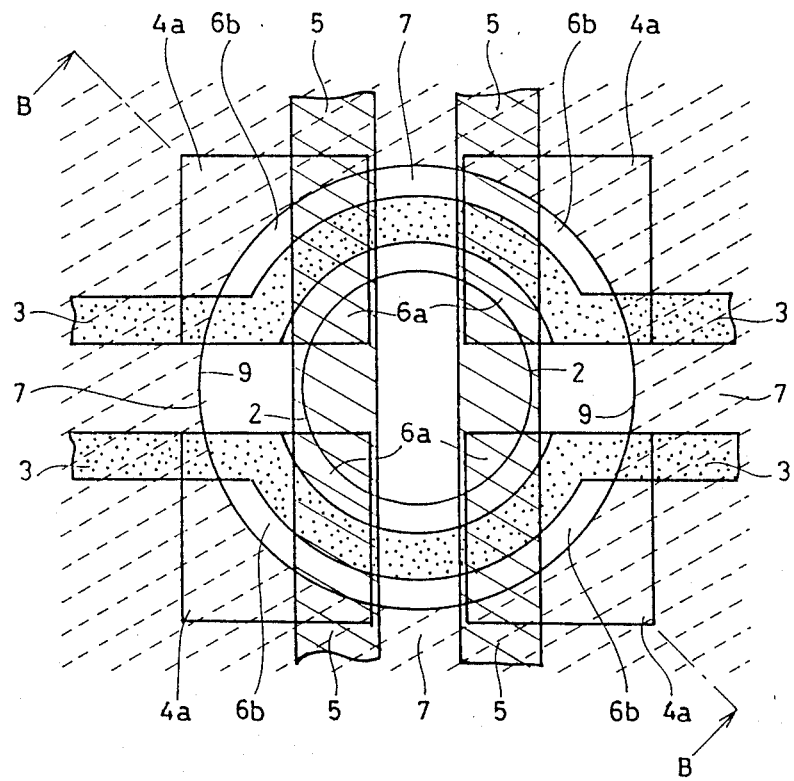
FIG. 4 is a schematic plan view of a semiconductor memory device in accordance with an embodiment of the present invention.
Figure 5:
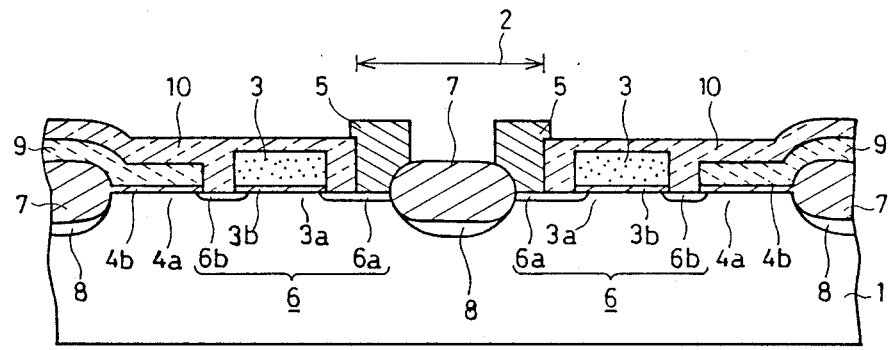
FIG. 5 is a schematic sectional view taken along the line B—B in FIG. 4.

Referring to FIG. 4, a schematic plan view of a dynamic-type semiconductor memory device is shown in accordance with an embodiment of the present invention. FIG. 5 is a sectional view taken along the line B—B in FIG. 4. Referring to FIGS. 4 and 5, a source region 6a and a drain region 6b of a transistor is formed on a major surface of a semiconductor substrate 1 and a capacitor region 4a is provided adjacent to the drain region 6b. These regions are isolated by an isolating region 7 and a channel cut 8 is formed under the isolating region 7. Word lines 3 are formed on a channel region 3a between the source region 6a and the drain region 6b through a gate insulating film 3b. Also, a capacitor electrode 9 is formed on a capacitor region 4a through a capacitor insulating film 4b. A plane region formed of the capacitor electrode 9 is shown by hatching of dotted lines in FIG. 4. These word lines 3 and the capacitor electrode 9 are covered with an insulating layer 10. Bit lines 5 formed on an insulating layer 10 are connected to a source region 6a through a contact hole 2 enclosed with the insulating layer 10.

As apparent from FIG. 4, four transistors 6 arranged in point symmetry about a contact hole 2 is isolated from each other by an isolating region 7, a single bit line 5 is connected to the source regions 6a of two transistors through a contact hole 2, and the other bit line is connected to the source regions 6a of the two other transistors through the same contact hole. That is, only one contact hole is necessary for four memory cells, with the result that a high degree of integration of semiconductor memory device becomes possible by a decrease in the number of contact holes.

Figure 7:
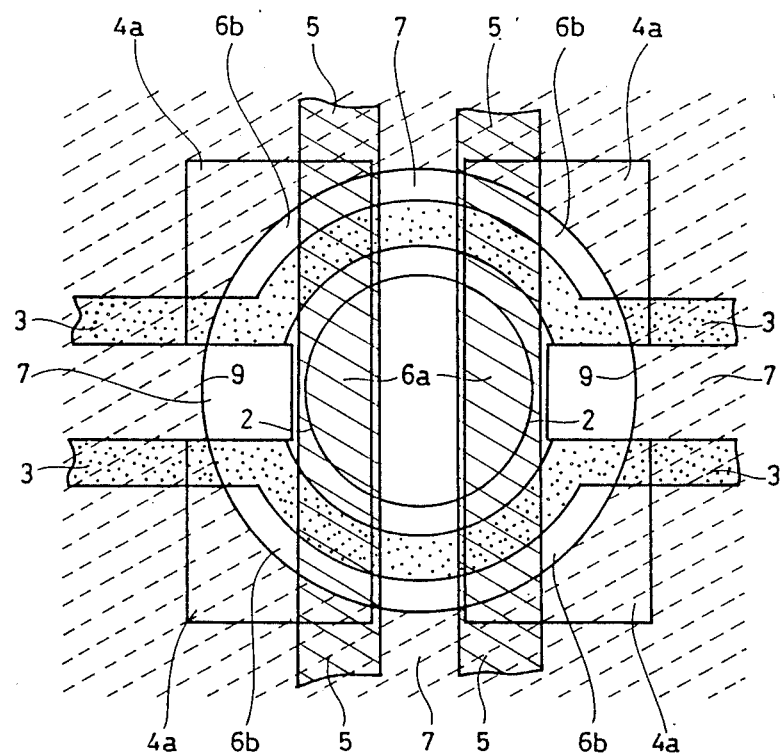
FIG. 7 is a plan view similar to FIG. 4, showing still other embodiment.

FIG. 7 is a plan view similar to FIG. 4 showing another embodiment with one portion changed. In this embodiment, source regions 6a of two transistors connected to the same bit line 5 are not isolated from each other by the isolating region 7 and formed as one common source region.

Figure 6:
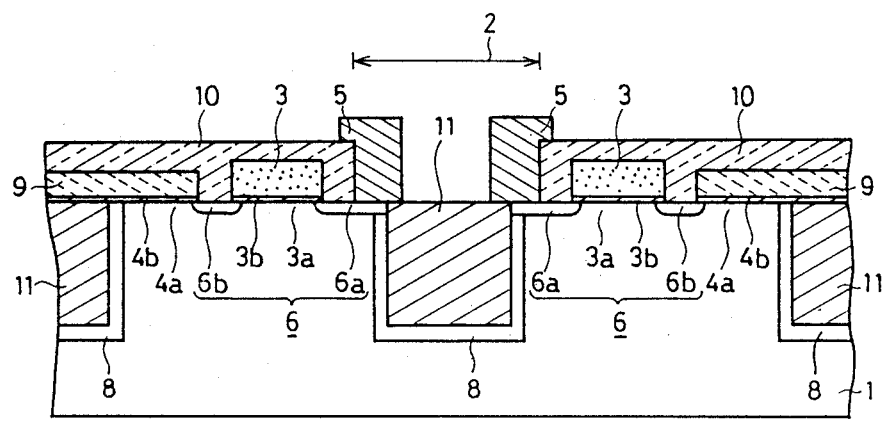
FIG. 6 is a sectional view similar to FIG. 5, showing another embodiment.

FIG. 6 is a sectional view similar to FIG. 5, showing another embodiment with one portion changed. In this embodiment, an isolating groove 11 is provided in place of an insulating oxide film 7. A channel cut 8 is provided on a side wall and a bottom surface of the isolating groove 11. Also, the isolating groove 11 may be filled with a insulating material 11a.

Figure 8:
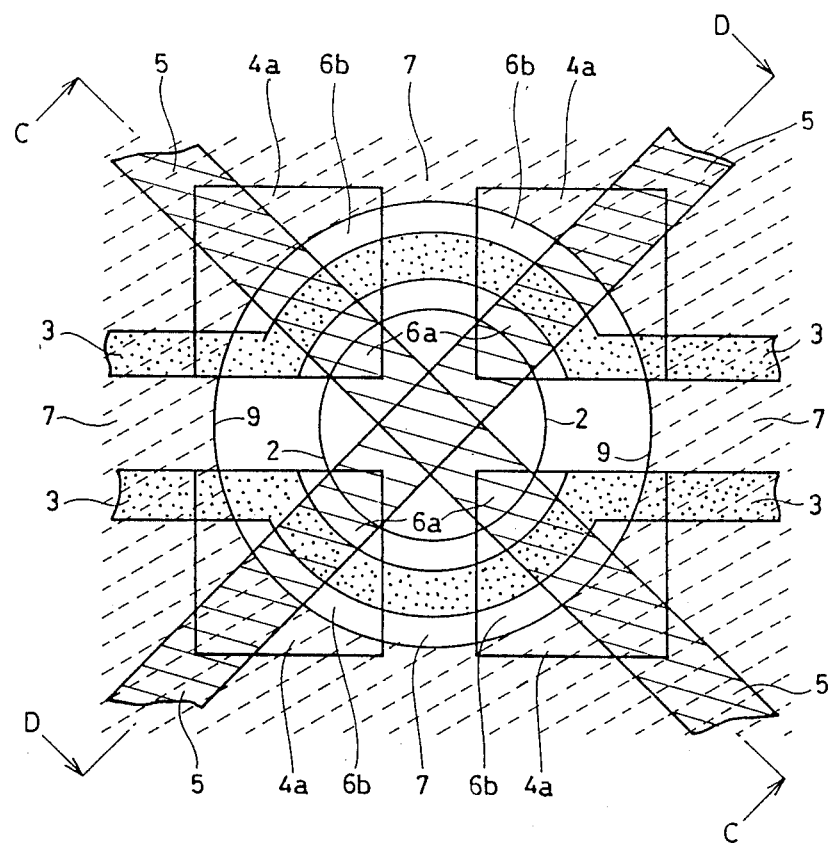
FIG. 8 is a schematic plan view showing a semiconductor memory device in accordance with still a further embodiment.

FIG. 8 is a plan view similar to FIG. 4, showing still a further embodiment. In this embodiment, an electric charge is written and read through a single bit line 5 in and from two memory cells in a point symmetry relation about the contact hole 2.

Figure 9:
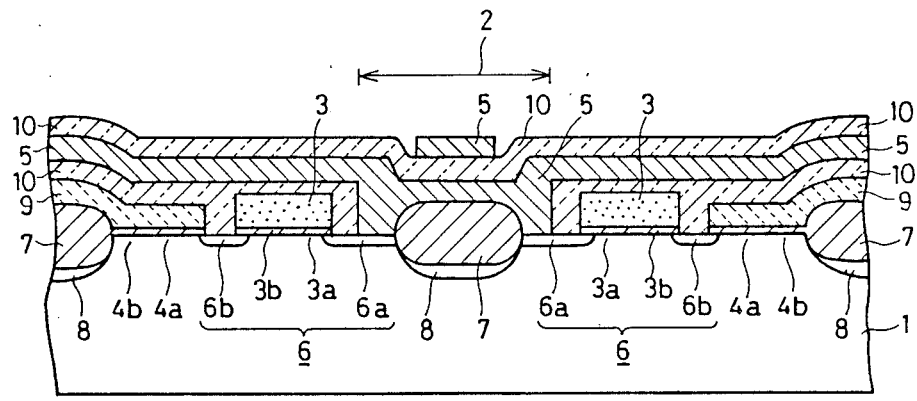
FIG. 9 is a schematic sectional view taken along the line C—C in FIG. 8.
Figure 10:
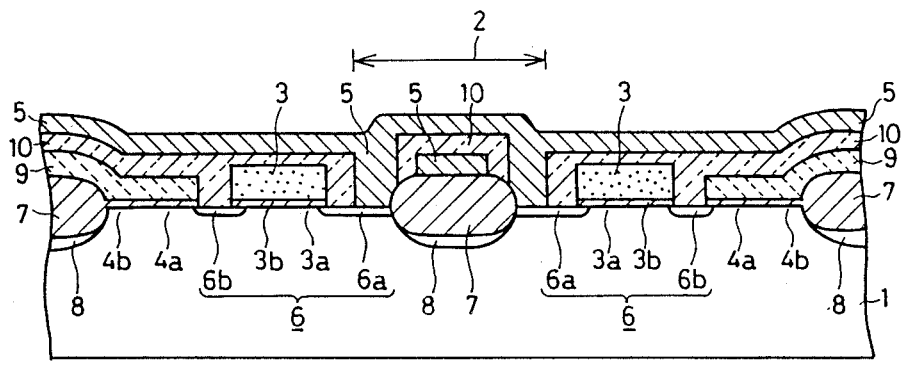
FIG. 10 is a schematic sectional view taken along the line D—D in FIG. 8.

FIGS. 9 and 10 are sectional views taken along the line C—C and the line D—D in FIG. 8, respectively. As apparent from these sectional views, two bit lines 5 are crossed in a three-dimension fashion with a multiple-layer connection on a contact hole and each bit line 5 is connected to a source region of transistors in two memory cells which are in a point symmetry relation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a semiconductor substrate,
   four memory cells arranged in point symmetry on said substrate, and
   one contact hole placed in the center of the point symmetry, wherein said contact hole comprises a wherein said contact hole comprises a plurality of contact regions electrically isolated from each other, said device further comprising
   one bit line connected to two memory cells through said contact hole and another bit line connected to the remaining two memory cells through the same contact hole.

2. A dynamic-type semiconductor memory device, comprising:
   a plurality of word lines;
   a plurality of bit lines intersecting with said plurality of word lines;
   a plurality of memory cells provided in correspondence with intersections of said word lines and said bit lines;
   means for receiving externally generated row and column address signals;
   memory cell selection means responsive to said externally generated row and column address signals for energizing said bit lines and said word lines to write information to or read information from a memory cell corresponding to the intersection of a selected word line and bit line;
   each said memory cell being included within a memory cell group formed of four adjacent memory cells comprising four transistors arranged symmetrically about a common contact hole;
   a first electrical connection formed between two of said transistors and a common one of said bit lines through said common contact hole;
   a second electrical connection formed between the remaining two of said transistors and another common one of said bit lines through said common contact hole;
   a third electrical connection formed between two of said transistors which are respectively connected to different bit lines by said first electrical connection and a common one of said word lines; and a fourth electrical connection formed between another remaining two of said transistors and another common one of said word lines, whereby four memory cells included within a said memory cell group are controlled by only two said bit lines and two said word lines.

3. A dynamic-type semiconductor memory device in accordance with claim 2, wherein said common contact hole comprises a plurality of contact regions isolated electrically from each other, and wherein said plurality of bit lines comprises one bit line connected to two memory cells through said contact regions and another bit line connected to the two other memory cells.

4. A dynamic-type semiconductor memory device in accordance with claim 3, wherein said plurality of contact regions are isolated from each other by an oxide film.

5. A dynamic-type semiconductor memory device in accordance with claim 3, wherein said plurality of contact regions are isolated by a groove.

6. A dynamic-type semiconductor memory device in accordance with claim 5, wherein said groove is filled with an insulating material.

7. A dynamic-type semiconductor memory device in accordance with claim 3, wherein said one bit line and said another bit line are formed to be in parallel.

8. A dynamic-type semiconductor memory device in accordance with claim 3, wherein said one bit line and said another bit line are formed to cross with each other in different planes at said contact hole region.

9. A dynamic-type semiconductor memory device in accordance with claim 3, wherein each said memory cell comprises a capacitor and a transistor, and said bit lines are connected to said transistors.

10. A dynamic-type semiconductor memory device in accordance with claim 9, wherein said transistor comprises a field-effect transistor.

* * * * *